United States Patent
Braly et al.

(10) Patent No.: US 7,204,934 B1
(45) Date of Patent: Apr. 17, 2007

(54) METHOD FOR PLANARIZATION ETCH WITH IN-SITU MONITORING BY INTERFEROMETRY PRIOR TO RECESS ETCH

(75) Inventors: Linda Braly, Albany, CA (US); Vahid Vahedi, Albany, CA (US); Erik Edelberg, San Francisco, CA (US); Alan Miller, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 788 days.

(21) Appl. No.: 10/002,676

(22) Filed: Oct. 31, 2001

(51) Int. Cl.
*H01L 21/66* (2006.01)
*G01L 21/30* (2006.01)

(52) U.S. Cl. .............. 216/59; 216/38; 216/60; 438/692; 438/9; 438/710

(58) Field of Classification Search .......... 216/38, 216/59, 67, 88, 60; 438/9, 692, 720, 710
See application file for complete search history.

(56) References Cited

U.S. PATENT DOCUMENTS

| | | | |
|---|---|---|---|
| 5,436,190 A | * | 7/1995 | Yang et al. ............ 438/296 |
| 5,578,161 A | * | 11/1996 | Auda .................... 156/626.1 |
| 5,926,722 A | | 7/1999 | Jang et al. |
| 5,960,254 A | * | 9/1999 | Cronin ................. 438/14 |
| 6,081,334 A | * | 6/2000 | Grimbergen et al. ....... 356/499 |
| 6,232,233 B1 | | 5/2001 | Chaudhary |
| 6,270,622 B1 | | 8/2001 | Klippert, II et al. ..... 156/626.1 |
| 6,284,665 B1 | | 9/2001 | Lill et al. ............... 438/710 |
| 6,635,573 B2 | * | 10/2003 | Pau et al. .............. 438/689 |

FOREIGN PATENT DOCUMENTS

EP    1 126 513 A1    8/2001

\* cited by examiner

*Primary Examiner*—Shamim Ahmed
(74) *Attorney, Agent, or Firm*—Martine Penilla & Gencarella, LLP

(57) ABSTRACT

A method for processing recess etch operations in substrates is provided including forming a hard mask over the substrate and etching a trench in the substrate using the hard mask, and forming a dielectric layer over the hard mask and in the trench, where the dielectric layer lines the trench. A conductive material is then applied over the dielectric layer such that a blanket of the conductive material lies over the hard mask and fills the trench, and the conductive material is etched to substantially planarize the conductive material. The etching of the conductive material triggers an endpoint just before all of the conductive material is removed from over the dielectric layer that overlies the bard mask. The conductive material is recess etched to remove the conductive material over the dielectric layer that overlies the hard mask and removes at least part of the conductive material from within the trench.

23 Claims, 13 Drawing Sheets

METHOD FOR PLANARIZATION ETCH WITH IN-SITU MONITORING BY INTERFEROMETRY PRIOR TO RECESS ETCH

BACKGROUND OF THE INVENTION

1. Field of the Invention

The present invention relates to wafer processing methods and, more particularly, to efficient and cost effective planarization etch operations for wafers.

2. Description of the Related Art

In the fabrication of semiconductor devices, there is a need to perform wafer planarization operations. Typically, integrated circuit devices are in the form of multi-level structures. Planarization and recess etch are important processes for the integration of embedded devices which are becoming more common. One of the intermediate steps in integration of embedded devices is to fill a previously etched medium to deep trench (or contact) with polysilicon, and to etch it back down to a certain depth. To insure a uniform fill, an excess layer of polysilicon (up to 3000 A) is deposited above a silicon nitride mask. As a result, the removal of polysilicon fill to a certain depth, has two main steps: planarization and recess etch. The planarization step is removing the excess polysilicon layer down to the mask level, and the recess etch step is removal of deposited polysilicon inside the trenches down to a certain depth. In a typical embedded device integration scheme, there are several recess etch steps. The third recess etch application (usually called Recess 3) is extremely challenging because the desired depth below the mask is very shallow. To ensure a controllable and uniform shallow depth in all trenches (or contacts) across the wafer, a very uniform planarization step is typically utilized. In particular, chemical mechanical planarization (CMP) operations are generally used to planarize polysilicon fillings between recess etch processes. Without planarization, fabrication of further polysilicon layers becomes substantially more difficult due to the variations in the surface topography.

A chemical mechanical planarization (CMP) system as is typically utilized to polish a wafer includes system components for handling and physically polishing the surface of a wafer. Such components can be, for example, an orbital polishing pad, or a linear belt polishing pad. Unfortunately, use of such a system can be extremely problematic. To planarize wafers in between etch operations typically requires transporting wafers from an etch machine to a CMP apparatus. Consequently, time is lost when wafers are being transported between the CMP apparatus and an etch apparatus. In addition, transporting wafers can increase the risk of contamination and may require additional cost and expense to minimize contamination during transport. Moreover, a device to transport the wafer between the CMP apparatus and the etch apparatus may be needed.

Furthermore, utilization of the CMP apparatus can have additional troublesome issues with respect to the wafer processing operations. For example, typical CMP apparatuses may be able to planarize a layer of a wafer by polishing away excess polysilicon, but in this process, endpoint of the polishing (or planarizing) process is typically detected by sensing contact with a different layer of the wafer after the first layer has been polished away. Unfortunately, this method may have difficulty in stopping the planarizing process before a part of the second layer is removed by the polishing. Consequently, this may present problems in multiple etching procedures because a single SiN protective layer is often utilized for all of the etches. In such a circumstance, CMP processes may strip away some or all of the SiN layer before the etching process is completed resulting in inconsistent wafer processing and possibly causing damage to the wafer.

Therefore, there is a need for an apparatus that overcomes the problems of the prior art by having a method of accurately planarizing a wafer in an etching chamber without taking the wafer out of the etching chamber where the extent of wafer polishing may be monitored accurately.

SUMMARY OF THE INVENTION

Broadly speaking, the present invention fills these needs by providing a method for etching and accurately planarizing wafers in one apparatus. It should be appreciated that the present invention can be implemented in numerous ways, including as a process, an apparatus, a system, a device or a method Several inventive embodiments of the present invention are described below.

In one embodiment, a method for processing recess etch operations in substrates is provided. The method includes forming a hard mask over the substrate and etching a trench in the substrate using the hard mask. The method also includes a dielectric layer is formed over the hard mask and in the trench, where the dielectric layer lines the trench A conductive material is then applied over the dielectric layer such that a blanket of the conductive material lies over the hard mask and fills the trench. The method further includes etching the conductive material to substantially planarize the conductive material where the etching of the conductive material triggers an end point just before all of the conductive material is removed from over the dielectric layer that overlies the hard mask. Then the conductive material is recess etched so as to remove the conductive material over the dielectric layer that overlies the hard mask and removes at least part of the conductive material from within the trench.

In another embodiment, a method for processing recess etch operations in substrates is provided. The methods includes: (a) forming a hard mask over the substrate; (b) etching a trench in the substrate using the hard mask; (c) forming a dielectric layer over the hard mask and in the trench where the dielectric lines the trench; (d) applying a conductive material over the dielectric layer such that a blanket of the conductive material lies over the hard mask and fills the trench; (e) etching the conductive material using a first chemistry to substantially planarize the conductive material where the etching of the conductive material triggers an endpoint just before all of the conductive material is removed from over the dielectric layer that overlies the hard mask, and the endpoint is triggered using interferometry monitoring; (f) recess etching the conductive material using a second chemistry and one of the interferometry monitoring and a timed etch so as to remove the conductive material over the dielectric layer that overlies the hard mask and removes at least part of the conductive material from within the trench; and (g) repeating operations (c) through (f) one or more times to form multiple layers of the conductive material in the trench.

In yet another embodiment, a method for processing recess etch operations in substrates is provided. The method includes forming a hard mask over the substrate and etching a trench in the substrate using the hard mask. The method also includes forming a silicon dioxide layer over the hard mask and in the trench where the silicon dioxide layer lines the trench. The method further includes applying a polysilicon material over the dielectric layer such that a blanket of the polysilicon material lies over the hard mask and fills the trench. Then the polysilicon material is etched to substantially planarize the polysilicon material where the etching of the polysilicon material triggers an endpoint just before all of the polysilicon material is removed from over the silicon dioxide layer that overlies the hard mask. The endpoint is triggered using interferometry monitoring, and the etching of the conductive material uses a first chemistry including $Cl_2$, He, and $SF_6$. The method then recess etches the polysilicon material using one of the interferometry monitoring and a timed etch so as to remove the polysilicon material over the silicon dioxide layer that overlies the hard mask and removes at least part of the polysilicon material from within the trench. The recess etching uses a second chemistry including $Cl_2$, He, and $SE_6$.

The advantages of the present invention are numerous. Most notably, by creating a method of planarizing a wafer by utilizing etching and in-situ interferometry, wafer production may be made more uniform and may take less time which can result in greater wafer yields and lower wafer production costs. The method involves the use of multiple etching chemistries and etch chamber conditions so different etching operations may be used for recess etching and for planarization etching. In addition, for the planarization process (and in some embodiments for recess etching), interferometry is utilized so accurate endpoint of polishing may be monitored in situ. In this way, both etching and planarization may be accurately conducted in an etching apparatus without having to transport the wafer to a CMP apparatus. Moreover, the planarization may be done in a more accurate manner than is typically available by utilizing CMP. This may result in a more controlled planarization process whereby a single hard mask may be utilized for multiple recess etches without fear that the hard mask may be removed by a CMP process. Additionally, because wafer does not have to be taken out of the etch apparatus and transported to the CMP apparatus for planarization, wafer may be significantly reduced and wafer throughput may be significantly increased. Consequently, by utilizing the methods of the present invention wafer production and wafer yield may be increased.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention is disclosed for a method to intelligently and accurately planarize wafers in between recess etch procedures without having to move the wafer out of an etch apparatus. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

In general terms, the present invention is directed toward a method whereby an etch process may be utilized in conjunction with in-situ interferometry to efficiently and accurately planarize wafers in between recess etch operations without the need to take the wafers out of etching apparatuses. By using such a method, wafer processing operations may be made more accurate and efficient because a CMP apparatus does not have to be utilized.

Figure 1:
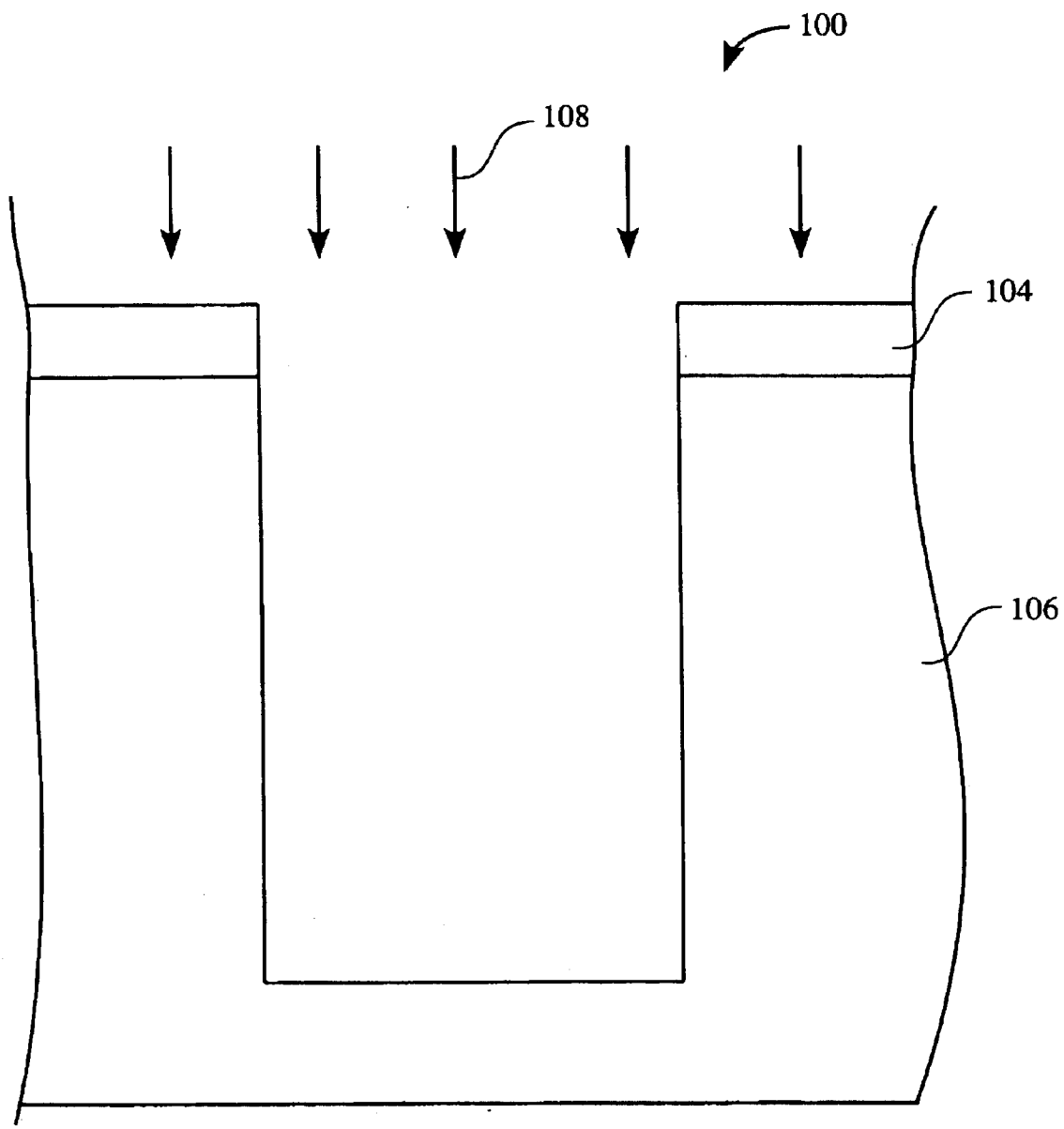
FIG. 1 shows a cross sectional view of a trench that has been etched into a wafer in accordance with one embodiment of the present invention.

FIG. 1 shows a cross sectional view of a trench 100 that has been etched into a substrate 106 of a wafer in accordance with one embodiment of the present invention. In FIG. 1, the trench 100 has been etched into a substrate 106. The substrate 106 is, in one embodiment, a silicon material. Typically, the trench 100 may be formed within the substrate 106 by use of an initial etching operation 108.

It should be understood that the trench 100 may be any depth depending on the specifications, desired for the device produced from the wafer. In one embodiment, the trench 100 is from about 10,000 A (Angstroms) to about 20,000 A in depth, and in a preferable embodiment, the trench 100 is about 15,000 A deep. As one skilled in the art would appreciated, the methods of the present invention may be utilized in any type or size of transistor technology such as for example, 0.10 μ technology, 0.13 μ technology, 0.18 μ technology, 0.25 μ technology, etc.

To produce the trench 100, a hard mask 104 is first formed over the substrate 106. Openings may be made in the hard mask 104 in locations where a trench is to be made. The openings may be made in any suitable operation such as, for example, photolithography and etching. For example, when photolithography is utilized, a resist film may be spin coated over the hard mask 104. Then a reticle having a pattern showing the location of the opening(s) is utilized. Light can then be projected through reticle after which the exposed regions of resist are removed.

Portions of the hard mask 104 shown by the exposed regions of the resist are then etched down to the substrate 106. Then the resist may be removed and the portion(s) of the substrate 106 exposed by the opening(s) in the hard mask 104 may be etched by an initial etching operation 108. It should be understood that the initial etching operation 108 may be any type of etching process which selectively etches into silicon but does not substantially etch into the hard mask 104. In one embodiment, the initial etching operation 108 into the substrate 106 may be a recess etch 130-1 as described below in reference to FIG. 3.

The hard mask 104 covers regions of the substrate 106 where trenching is not desired. In this way, trenches may be selectively formed in the substrate 106. Although any type of material may be utilized for the hard mask 104, in one embodiment, a silicon nitride material is used. In one embodiment, the hard mask 104 is from about 1,000 A to bout 2,000 A in thickness, and in a preferred embodiment, the hard mask 104 is about 1,500 A in thickness.

Figure 2:
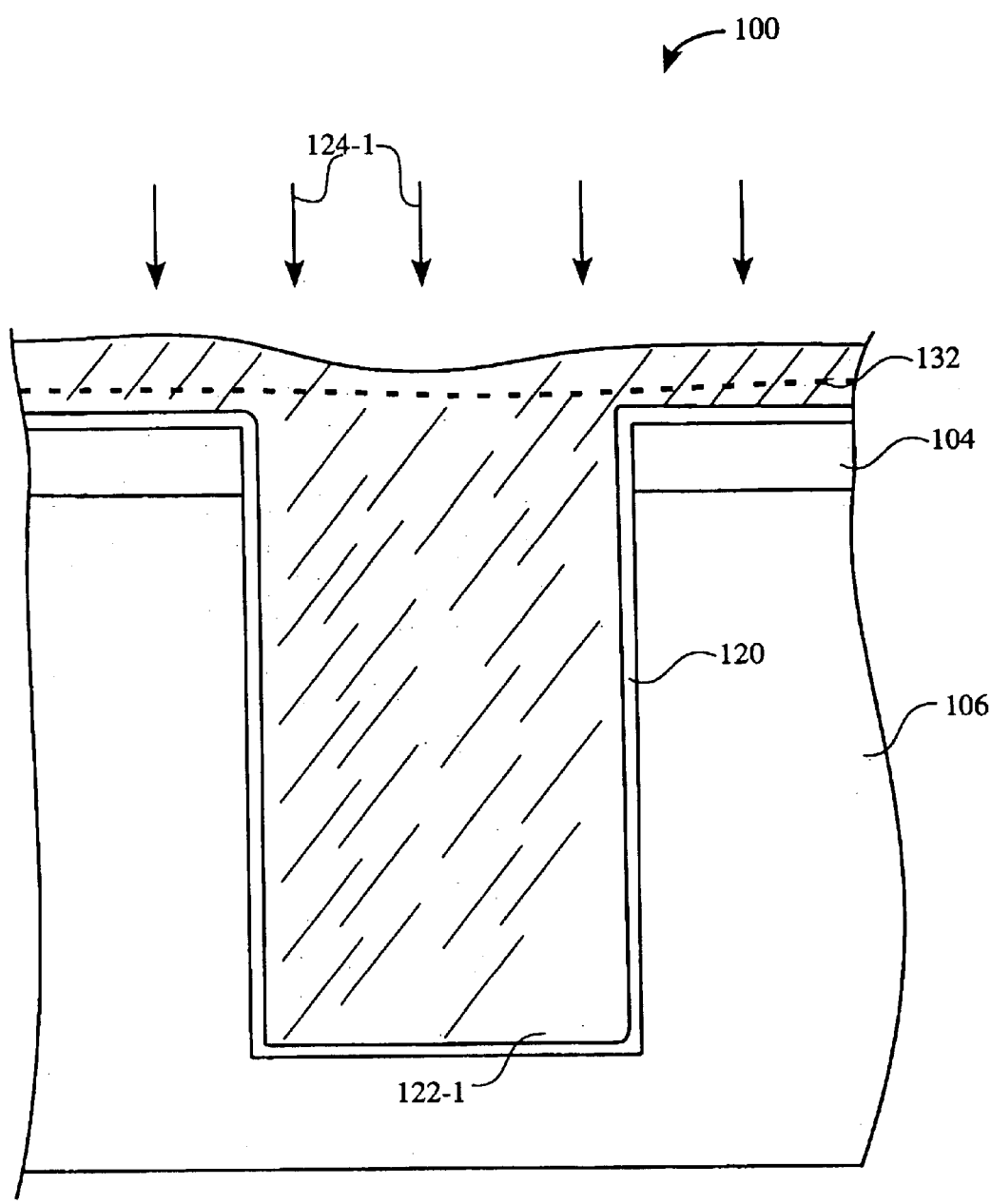
FIG. 2 shows a view of the substrate after an dielectric layer has been applied to a surface of the trench, and the trench has been filled with polysilicon in accordance with one embodiment of the present invention.

FIG. 2 shows a view of the substrate 106 after a dielectric layer 120 has been applied to a surface of the trench 100, and the trench 100 has been filled with polysilicon 122-1 in accordance with one embodiment of the present invention. It should be understood that although a polysilicon material is utilized in the exemplary embodiments contained herein, any other type of conductive material may be utilized instead of polysilicon. The dielectric layer 120 may be any type of oxide layer that has a relatively low dielectric constant. In one embodiment, the dielectric layer 120 is a silicon dioxide layer and is between about 50 A to about 100 A in thickness.

The polysilicon 122-1 may fill and cover the trench 100 to any thickness above the hard mask 104 as long as the accuracy or speed of the wafer processing is not substantially compromised. In one embodiment, the thickness of the polysilicon 122-1 above the hard mask may be between about 1000 A and about 5000 A. Because of topological differences of the substrate 106, an excess amount of the polysilicon 122-1 is applied to ensure uniform fill. In this embodiment, a planarization etch 124-1 is utilized to planarize the polysilicon 122-1 down to a level above the hard mask 104 as shown by line 132.

In one embodiment, the planarization etch 124-1 is an ion assisted etch and utilizes the chemistries and etch apparatus conditions as shown in Table A.

TABLE A

Exemplary Planarization Etch Chemistry
Implementing IEP Etch Endpoint Detection
First Alternative Chemistry
$Cl_2/He/SF_6$

| Ranges | Top Power (watts) | Bottom Power (watts) | Flow Rates (sccms) | | | Pressure (mTorr) | Temp (C.) |
| --- | --- | --- | --- | --- | --- | --- | --- |
| | | | $Cl_2$ | He | $SF_6$ | | |
| Range | 300 to 1200 | 30 to 300 | 20 to 200 | 20 to 500 | 2 to 50 | 3 to 20 | −10 to 80 |
| Preferred | 1000 | 66 | 100 | 100 | 10 | 5 | 30 |

In one embodiment of the planarization etch 124-1, the top power in an etch chamber is from about 300 watts to about 1200 watts, and in a preferred embodiment, the top power is about 1000 watts. The bottom power of the etch chamber in one embodiment is from about 30 watts to about 300 watts with a preferred embodiment utilizing about 66 watts. With respect to the flow rates of the chemicals utilized in the etch chamber, $Cl_2$ and He have a flow rate of about 20 sccms to about 200 sccms with the most preferred flow rate being about 100 sccms. $SF_6$ has a flow rate of about 2 sccms to about 50 sccms, and in a preferred embodiment, $SF_6$ has about a 10 sccms flow rate. The pressure in the etch chamber is from about 3 mTorr to about 20 mTorr in one embodiment, and the pressure is about 5 mTorr in a preferred embodiment. The temperature in the etch chamber in one embodiment is from about −10 C. (degrees Celsius) to about 80 C. while the temperature is about 30 C. in a preferred embodiment.

It should be appreciated that other chemicals may be utilized in place of the exemplary chemicals in the embodiment as shown in FIG. A. For example, any noble gas may replace He such as for example, Ar, etc. In another embodiment, any flourine containing compound may replace $SF_6$ such as, for example, $NF_3$, $CF_4$, $CBF_3$, etc. In yet another embodiment, other chemicals may be substituted for $Cl_2$ such as, for example, HBr and HCl, etc.

The planarization etch 124-1 is used along with interferometry to achieve in-situ monitoring of how much of the polysilicon 122-1 above the hard mask 104 is planarized. It should be understood that any type of interferometry may be utilized to monitor etching processes as long as the monitoring of the planarization can be done accurately. In one embodiment, as discussed in further detail in reference to FIG. 13, with use interferometric endpoint (IEP) detection, two light signals with different wavelengths are utilized to determine when the planarization etch 124-1 has removed enough of the polysilicon 122-1 from the surface of the substrate 106 to achieve a substantially planarized surface. In one embodiment, the planarization etch 124-1 planarizes just enough of the polysilicon 122-1 so the hard mask 104 and the dielectric layer 120 are untouched. In this embodiment, about 10 Å to about 300 Å in thickness of the polysilicon 122-1 remains over the hard mask 104 and the dielectric layer 120 after the planarization etch 124-1 has been completed. In a preferred embodiment, between about 50 Å to about 200 Å of the polysilicon 122-1 remain over the hard mask 104 and the dieletric layer 120 after the planarization etch 124-1.

Figure 3:
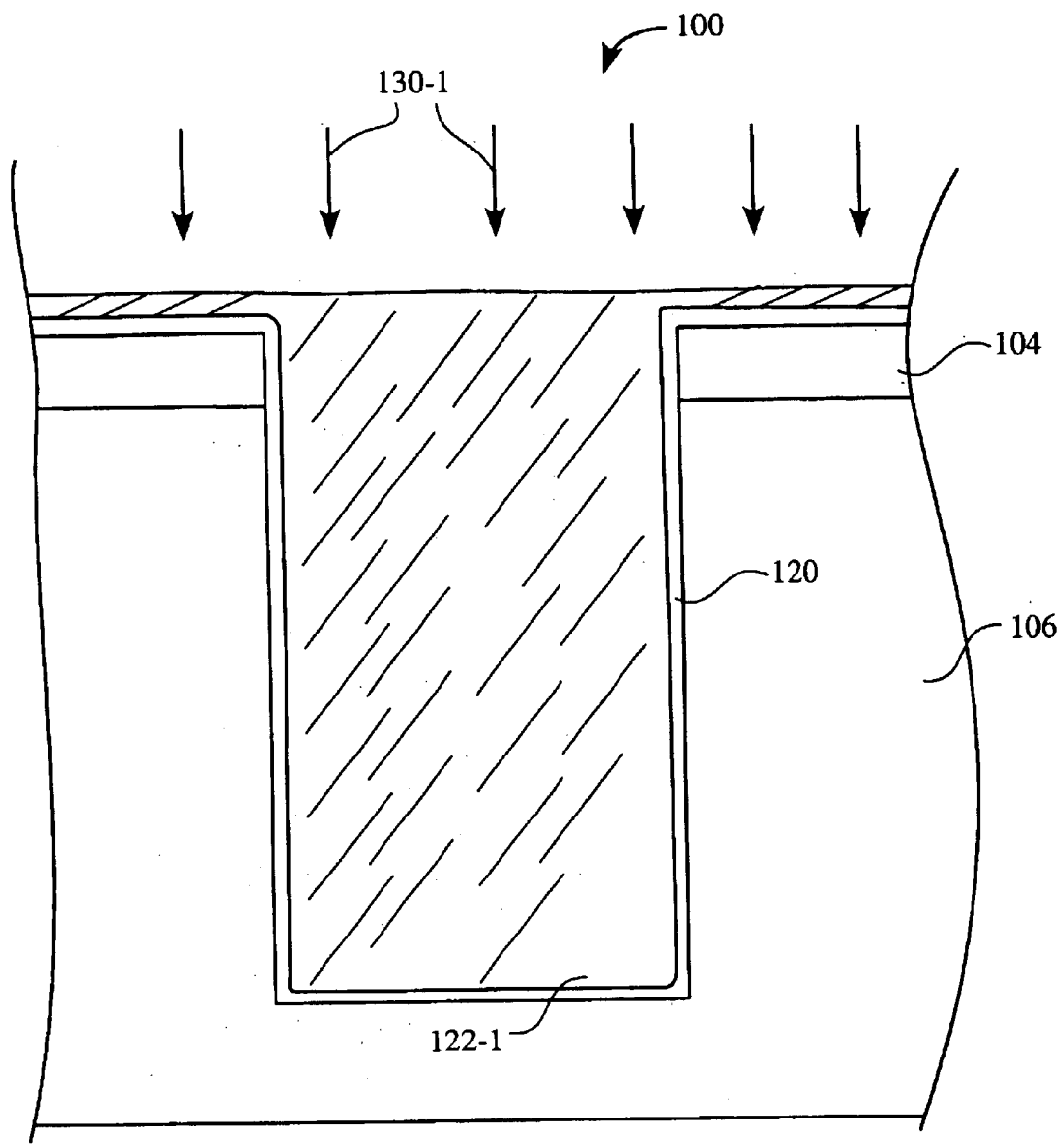
FIG. 3 illustrates the trench of FIG. 2 after the planarization etch has been conducted in accordance with one embodiment of the present invention.

FIG. 3 illustrates the trench 100 of FIG. 2 after the planarization etch 124-1 has been conducted in accordance with one embodiment of the present invention. At this point, a recess etch 130-1, which in one embodiment is an ion assisted etch, may be utilized to partially etch the polysilicon 122-1 in the trench 100. Table B shows one embodiment of the chemical conditions and etch apparatus conditions defining an example of the recess etch 130-1.

TABLE B

| Exemplary | Second Chemistry Ar/SF$_6$ | | | | |
|---|---|---|---|---|---|
| Etch Chemistry | Top Power | Bottom Power | Flow Rates (sccms) | Pressure | Temp |
| Ranges | (watts) | (watts) | Ar | SF$_6$ | (mTorr) | (C) |
| Range | 130 to 500 | 0 to 30 | 0 to 300 | 10 to 100 | 5 to 20 | 10 to 60 |
| Preferred | 175 | 0 | 200 | 15 | 10 | 30 |

As indicated in Table B an Ar/SF$_6$ is utilized in one embodiment It should be appreciated that any noble gas may be substituted for Ar such as for example helium, etc. Any other fluorine containing compound may be utilized in place of SF$_6$ such as, for example, CF$_4$. In this embodiment, the top power range is from about 130 to about 300 watts. In a preferred embodiment, the top power is about 175 watts. The bottom power, in one embodiment, may be between about 0 watts and about 30 watts. In one embodiment, the flow rate for Ar may be between about 0 and and 300 sccms. A preferred flow rate for Ar is about 200 sccms. The flow rate, in one embodiment, for SF$_6$ is between about 10 sccms and about 100 sccms. A preferred flow rate for SF$_6$ is about 15 sccms. The pressure of the gases (i.e. Ar/SF$_6$) is from about 5 to about 20 mTorr, and a preferred pressure is about 10 mTorr. The preferred temperature of the gases is from about 10 to about 60 C., and the most preferred temperature is about 30 C. By use of the embodiment in the "recipe" of Table 1, selective etching of the polysilicon 122-1 in substrate 106 may be controlled so the right amount of recess etching may be conducted. In one embodiment, the amount of etching may be done by varying the time of etching (e.g. timed etching). In another embodiment, interferometry (as described in reference to FIG. 13) may be utilized. Additionally, the recess etch 130-1 is selective so the hard mask 104 remains substantially intact and loses little, if any, thickness during the recess etch 130-1 process. In one embodiment, the recipe of Table A for the recess etch 130-1 removes less than 200 Å of the hard mask 104.

Figure 4:
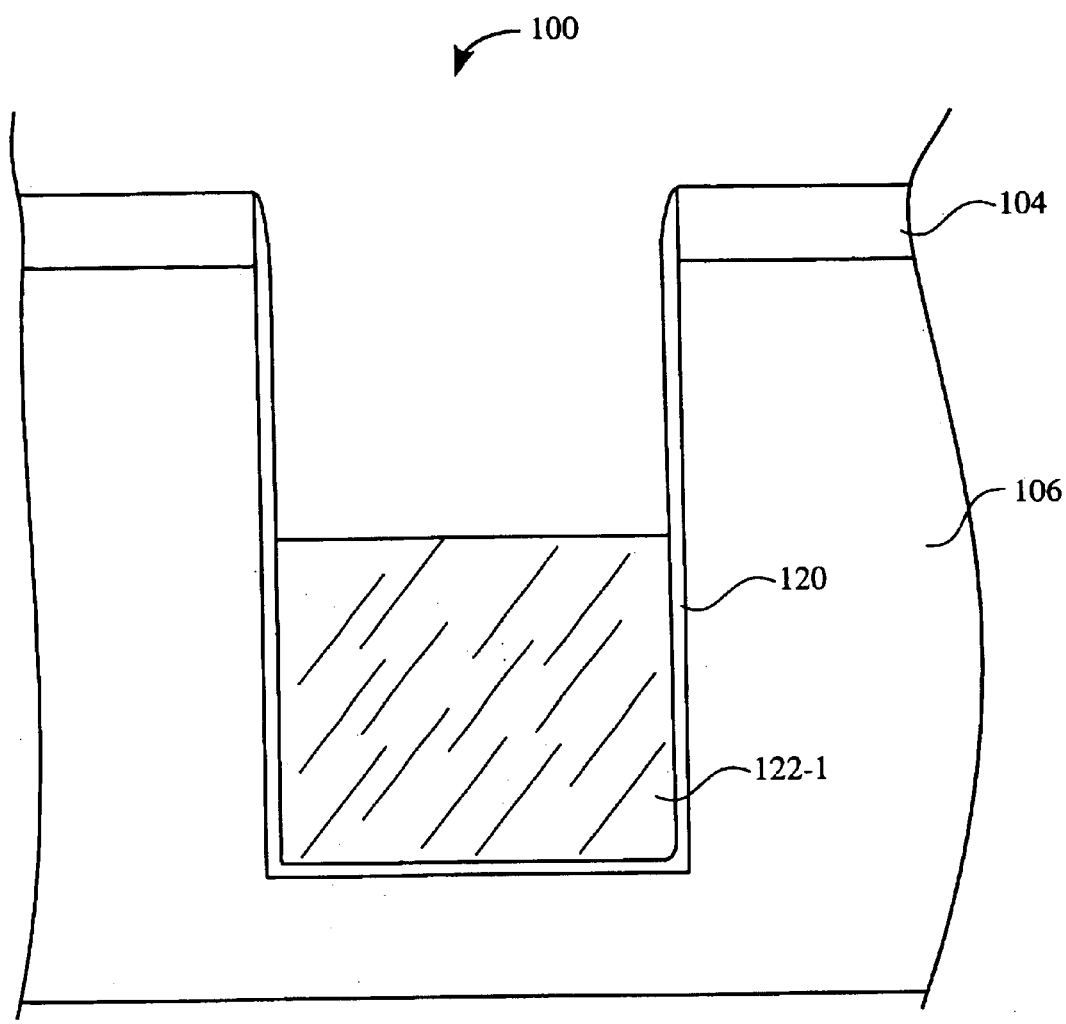
FIG. 4 shows an exemplary structure of the trench after the recess etch is completed in accordance with one embodiment of the present invention.

FIG. 4 shows an exemplary structure of the trench 100 after the recess etch 130-1 is completed in accordance with one embodiment of the present invention. In this embodiment, a first recess etch (also known as recess-1 etch) leaves a portion of the trench 100 filled with the polysilicon 122-1. It should be appreciated that the recess-1 etch may leave any amount of polysilicon 122-1 in the trench 100 depending on the desired thickness of the layer formed by the polysilicon 122-1.

Figure 5:
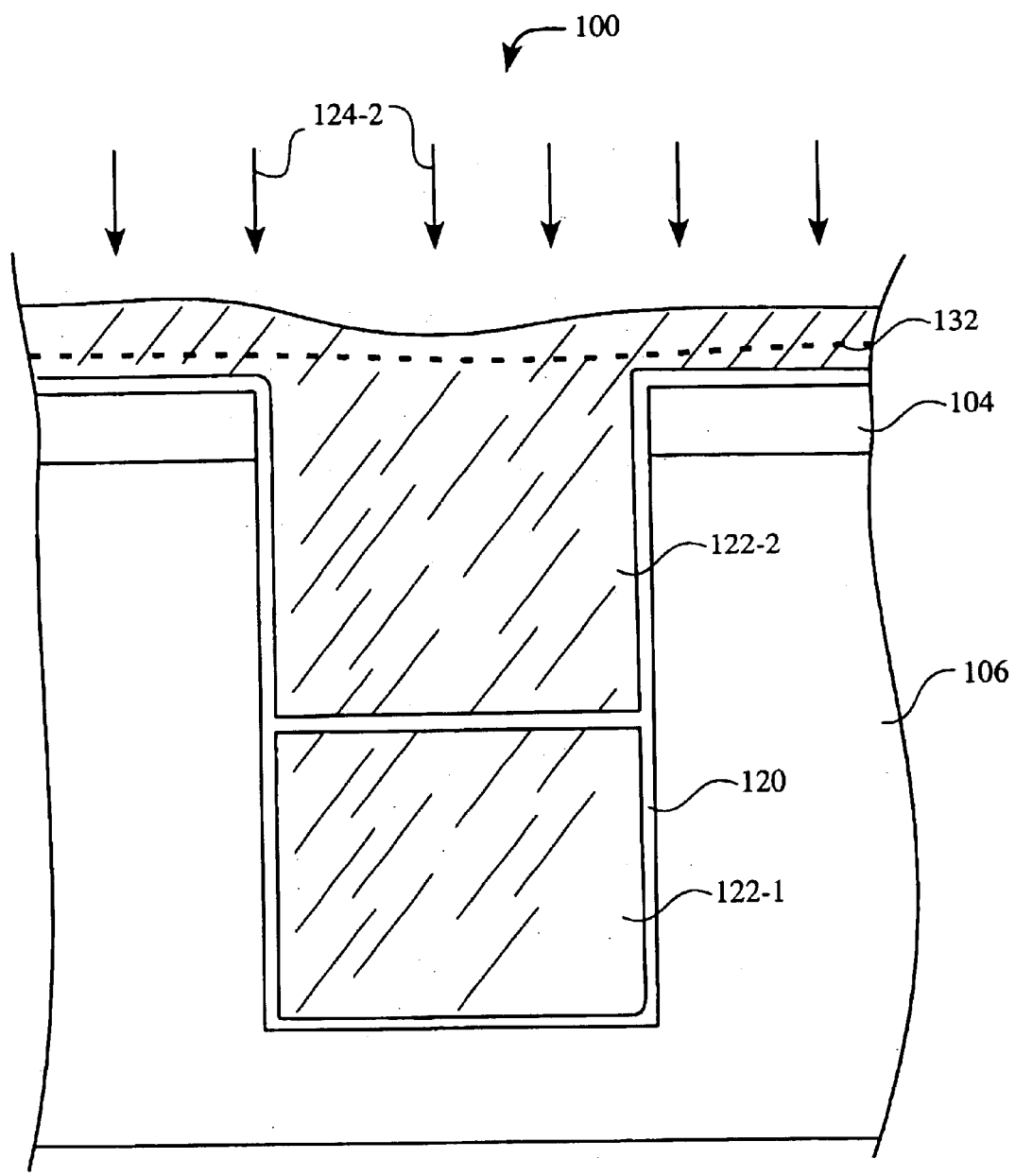
FIG. 5 shows an exemplary structure of the trench after the structure such as one shown in FIG. 4 has been lined with the dielectric layer and filled with polysilicon in accordance with one embodiment of the present invention.

FIG. 5 shows an exemplary structure of the trench 100 after the structure such as one shown in FIG. 4 has been lined with the dielectric layer and filled with polysilicon 122-2 in accordance with one embodiment of the present invention. In one embodiment, the planarization etch 124-2 is utilized to planarize a top surface of the polysilicon 122-2 down to just above the dielectric layer 120 that is over the hard mask 104. The planarization etch 124-2 may utilize the chemistry and etch apparatus conditions such as one discussed in reference to FIG. 2. In addition, interferometry as discussed in reference to FIG. 13 may be utilized to accurately planarize the polysilicon 122-2. After the planarization etch 124-2, the thickness of the the polysilicon 122-2 over the dielectric layer 120 and the hard mask 104 may be between about 50 to about 200 A.

Figure 6:
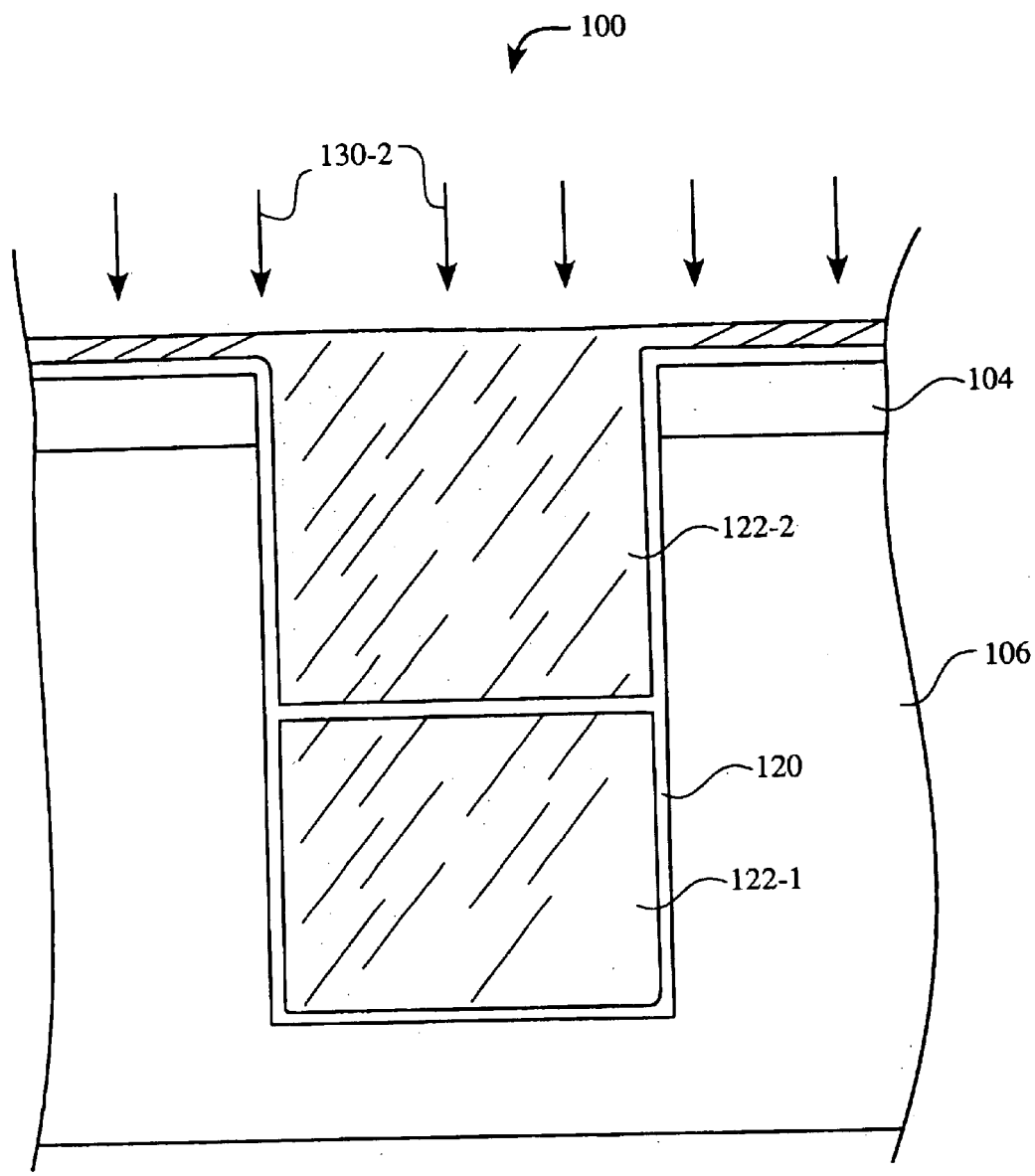
FIG. 6 shows an exemplary structure of the trench after a planarization etch is utilized for a recess-2 structure in accordance with one embodiment of the present invention.

FIG. 6 shows an exemplary structure of the trench 100 after a planarization etch 124-2 is utilized for a recess-2 structure in accordance with one embodiment of the present invention. After the planarization etch 124-2 is finished on the structure as described in FIG. 5, the recess etch 130-2 may be used to conduct a recess-2 etch. The recess-2 etch is a second recess etch that defines a second polysilicon structure within the trench 100. In this embodiment, the chemistries and the etch chamber conditions utilized in the recess etch as described in reference to FIG. 3 may be utilized to conduct the recess-2 etch. The recess-2 etch may be done in conjunction with interferometry as described in reference to FIG. 13 to remove the polysilicon 122-2 in the trench 100 down to a certain depth. It should be understood that the recess-2 etch may etch down to any depth of the polysilicon 122-2 depending on the desires for the thickness of the polysilicon 122-2.

Figure 7:
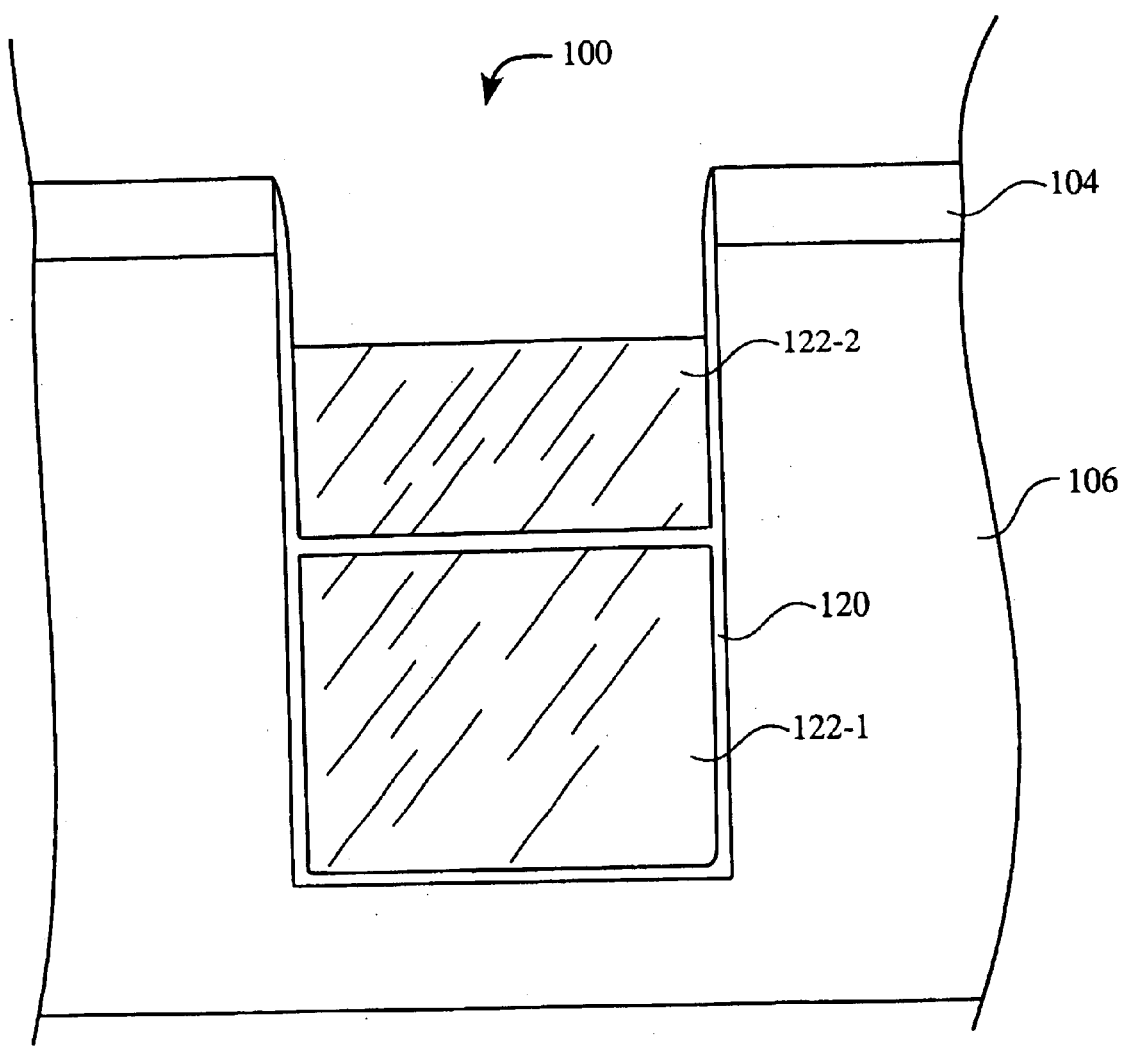
FIG. 7 shows an exemplary structure of the trench after the recess-2 etch as been completed in accordance with one embodiment of the present invention.

FIG. 7 shows an exemplary structure of the trench 100 after the recess-2 etch as been completed in accordance with one embodiment of the present invention. The polysilicon 122-2 has been etched by a selective etch such as the recess etch 130-2.

Figure 8:
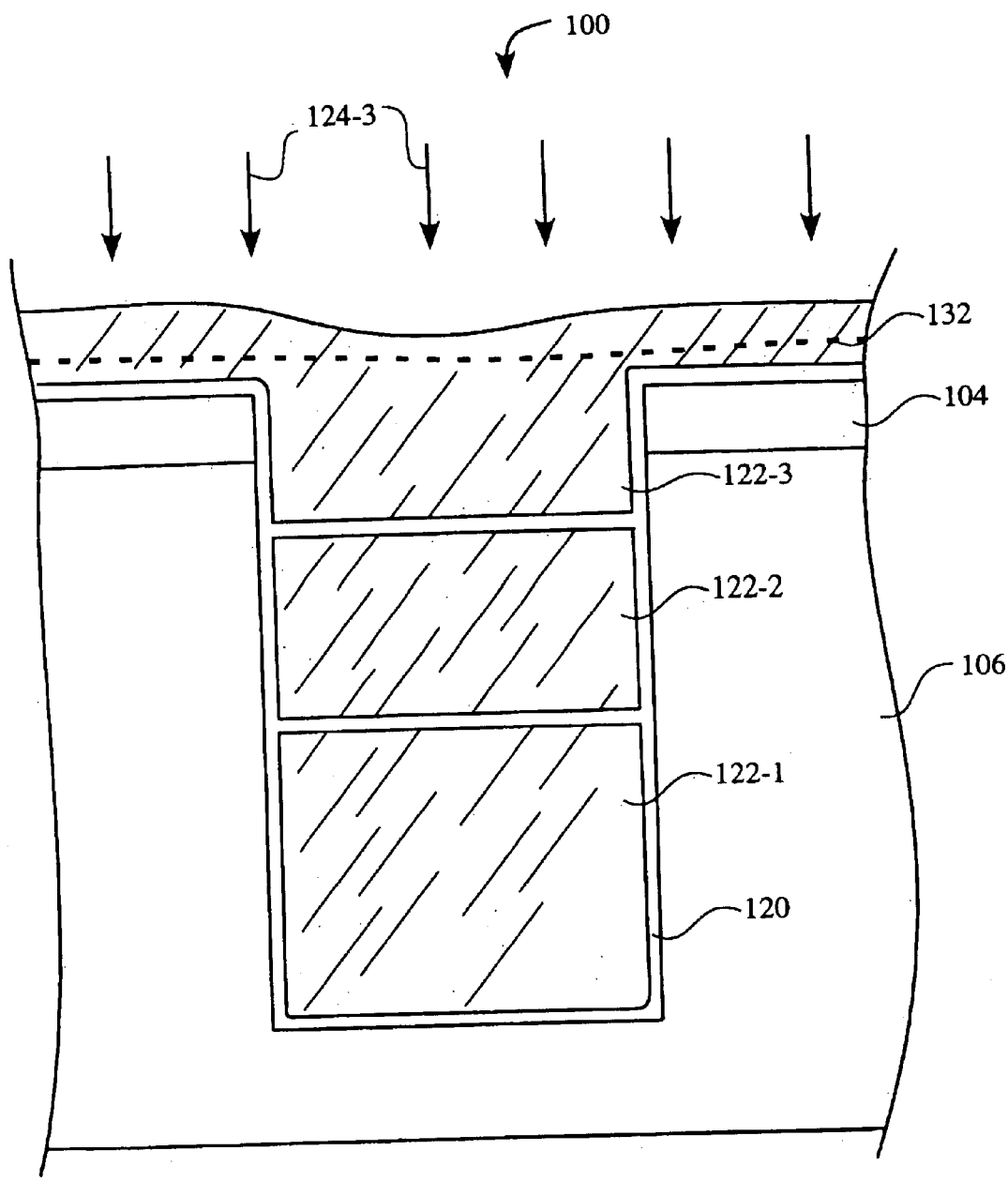
FIG. 8 shows an exemplary structure of the trench where the trench structure as shown in FIG. 7 is lined with the silicon dioxode and is filled with polysilicon in accordance with one embodiment of the present invention.

FIG. 8 shows an exemplary structure of the trench 100 where the trench structure as shown in FIG. 7 is lined with the silicon dioxode 120 and is filled with polysilicon 122-3 in accordance with one embodiment of the present invention. In this embodiment, the planarization etch 124-3 is utilized with the chemistries and etch apparatus conditions as described in reference to FIG. 2. Therefore, the polysilicon 122-3 is planarized so a thin layer of polysilicon 122-3 remains over the hard mask 104. Again, the hard mask 104 is left intact and the planarization etch 124-3 is stopped using interferometry end point detection as described in further detail in reference FIG. 13. The thickness of the dielectric layer 120 and the polysilicon 122-3 over the hard mask 104 is in one embodiment, as described with reference to the polysilicon 122-1 and 122-2 in FIGS. 3 and 5. Consequently, the hard mask 104 remains intact through multiple recess etchings because CMP does not have to be utilized and the planarization etch 124-3 is stopped before all polysilicon above the hard mask 104 and the dielectric layer 120 is removed in the planarization etch 124-3. In one embodiment, hard mask 104 remaining after all three recess etches is about 500 Å in thickness.

Figure 9:
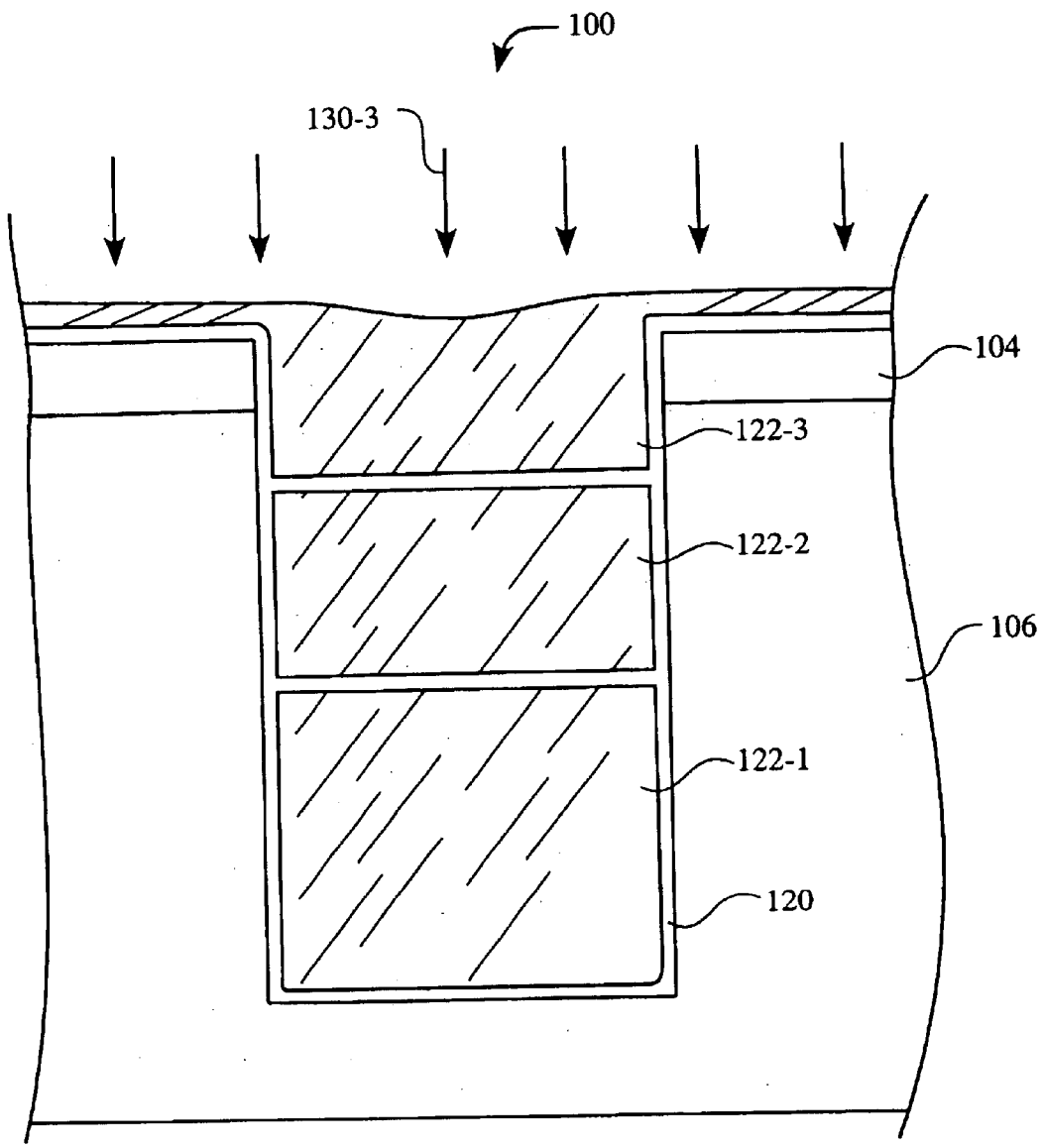
FIG. 9 shows a structure of the trench during a recess-3 etch operation in accordance with one embodiment of the present invention.

FIG. 9 shows a structure of the trench 100 during a recess-3 etch operation in accordance with one embodiment of the present invention. In this embodiment, the recess etch 130-3 is conducted in a third recess etch operation (i.e., recess etch-3). In one embodiment, the recess etch 130-3 is conducted with the chemistries and etch apparatus conditions as described in Table B in reference to FIG. 3. Recess etching (i.e. the recess etches 130-1, 130-2, and 130-3) of the present invention may be utilized in recess-1, recess-2, and recess-3 etches to produce any type of polysilicon 122-1 122-2, and 122-3 thicknesses such as, for example, where all of the polysilicon 122-1, 122-2, and 122-3 layers are the same in thickness, or where one or two of the polysilicon 122-1, 122-2, and 122-3 are thicker than the other layer(s). In one embodiment, the recess etch 130-3 is utilized with interferometric endpoint (IEP) detection to produce a lesser amount of etching of the polysilicon 122-3 than with the etching for polysilicon 122-1 and 122-2. In one embodiment, the polysilicon 122-3 is etched until a top surface of the polysilicon 122-3 is about 300 A below a bottom surface of the hard mask 104.

Figure 10:
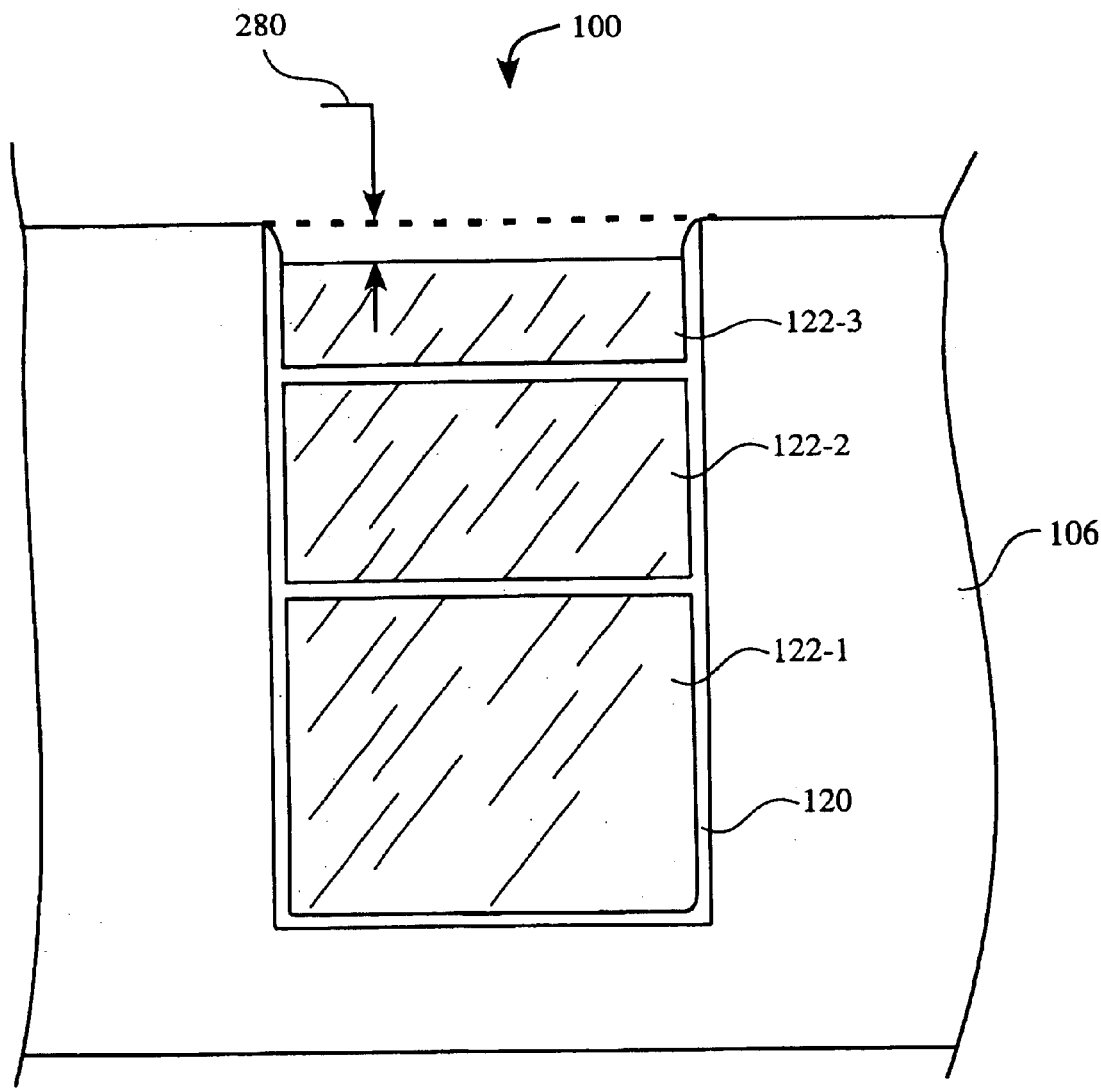
FIG. 10 shows the structure of the trench of FIG. 9 after the recess etch-3 has removed a portion of the polysilicon and after the hard mask has been removed in accordance with one embodiment of the present invention.

FIG. 10 shows the structure of the trench 100 of FIG. 9 after the recess etch-3 has removed a portion of the polysilicon 122-3 and after the hard mask 104 has been removed in accordance with one embodiment of the present invention. In this embodiment, a gap 280 has been left between a top surface of the substrate 106 and a top surface of the polysilicon 122-3. It should be appreciated that the gap 280 may be any size depending on the desired trench structure. In one embodiment the gap 280 is from about 100 A to about 800 A in depth. In a preferred embodiment, the gap 280 is about 300 A. In addition the hard mask 104 may be removed with any appropriate hard mask removal agent such as, for example, HF solution.

Figure 11:
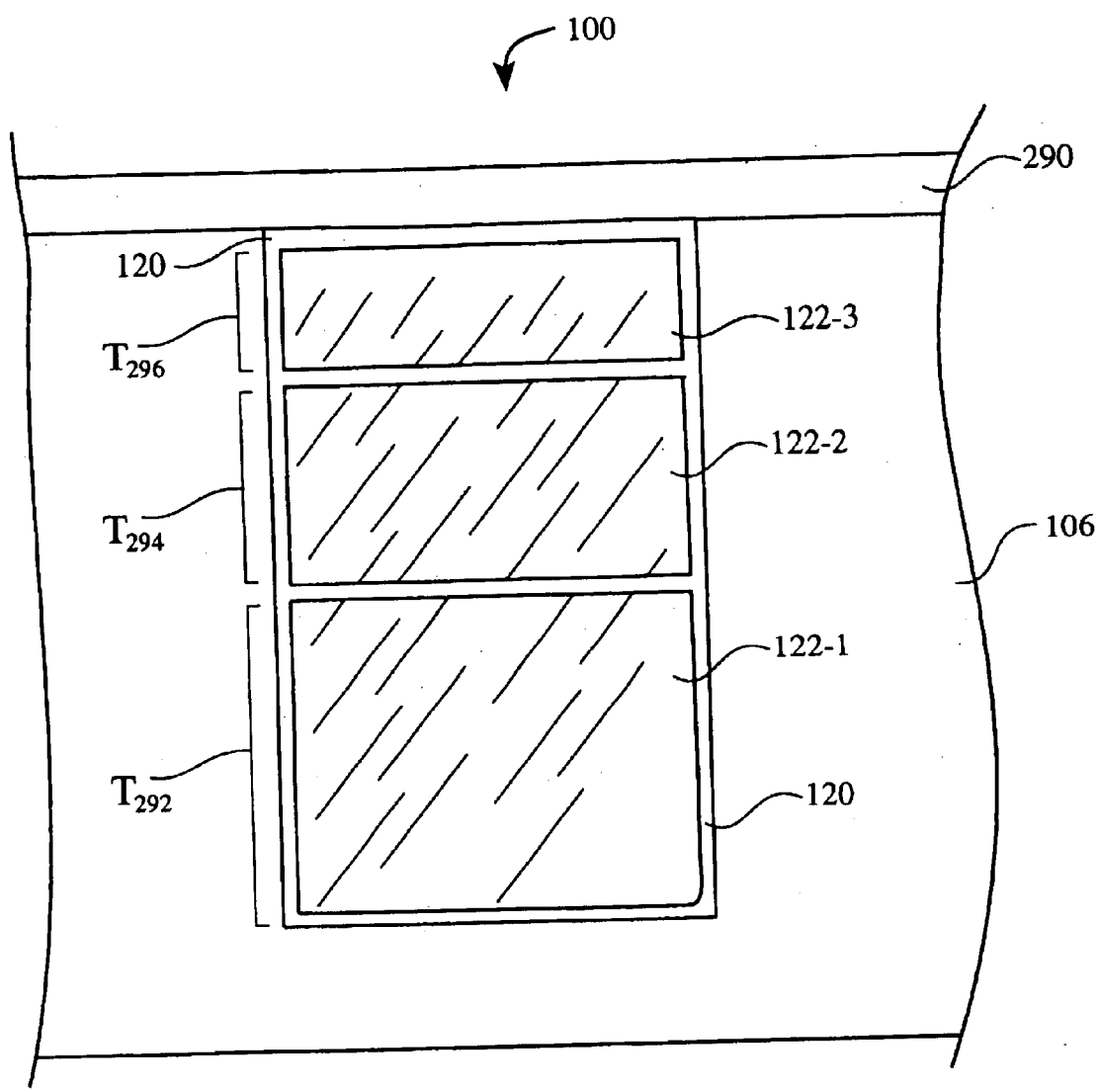
FIG. 11 shows the trench after three recess etches as shown in FIG. 10 with the dielectric layer added to the trench and with an interlayer dielectric (ILD) covering over the trench in accordance with the one embodiment of the present invention.

FIG. 11 shows the trench 100 after three recess etches as shown in FIG. 10 with the dielectric layer 120 added to the trench 100 and with an interlayer dielectric (ILD) covering over the trench 100 in accordance with the one embodiment of the present invention. In this embodiment, the gap 280 above the polysilicon 122-3 in the trench structure as shown in FIG. 10 may be filled with a dielectric such as, for example, silicon dioxide. After the filling, the trench 100 may be covered with an interlayer dielectric (ILD) 290. The ILD 290 may be any type of material with a low dielectric constant such as, for example, silicon dioxide, silicon nitride, etc.

The polysilicon 122-1, 122-2, and 122-3, in one embodiment, have thicknesses as shown by $T_{292}$, $T_{294}$, and $T_{296}$ respectively. In this embodiment, $T_{292}$ may be between about 10000 A to about 100000 A in thickness, $T_{294}$ may be between about 2000 A to about 10000 A in thickness, and $T_{296}$ may be between about 300 and 2000 A in thickness.

Figure 12:
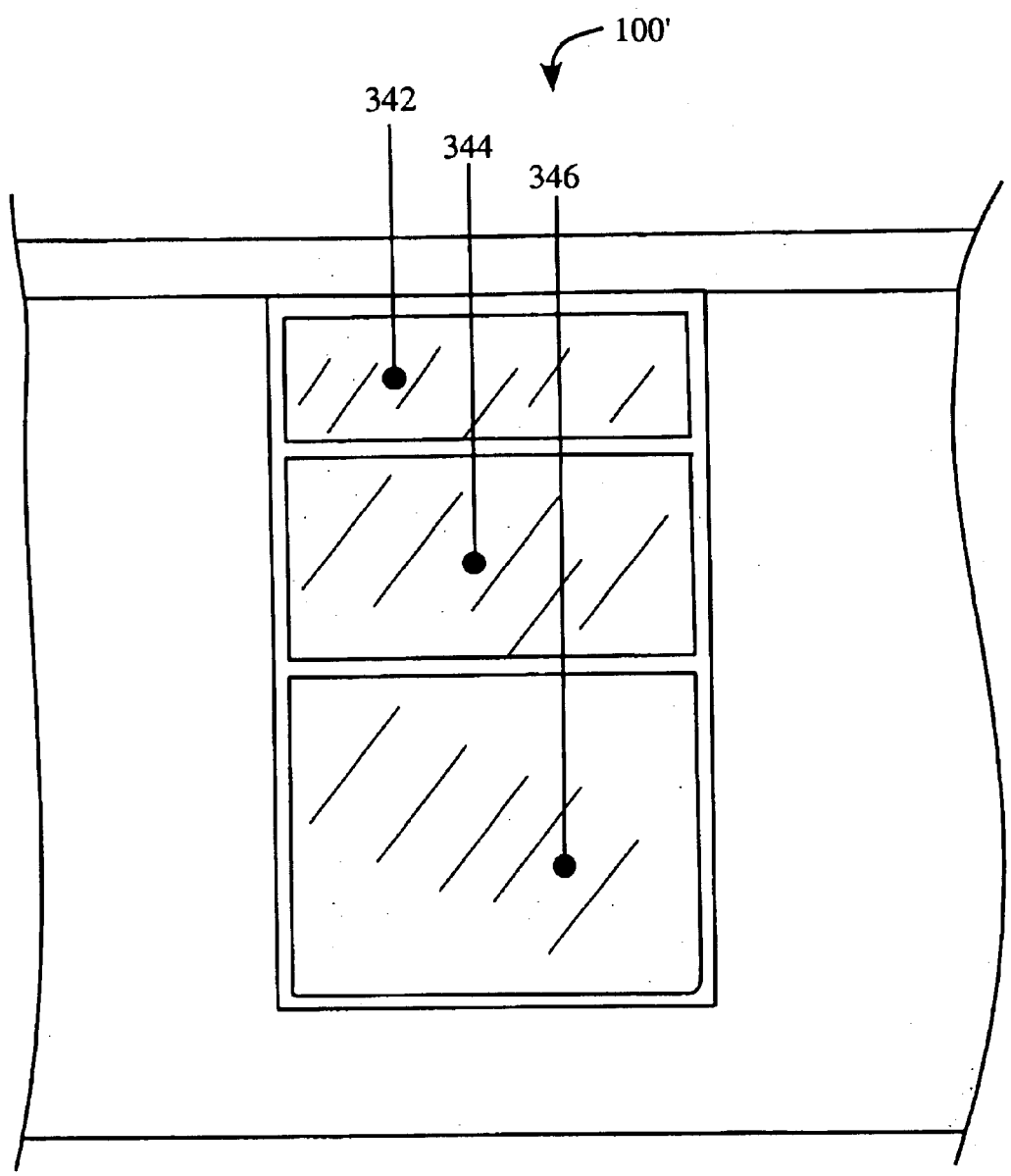
FIG. 12 shows the structure of the trench where conductive lines enter into three layers of polysilicon in accordance with one embodiment of the present invention.

FIG. 12 shows the structure of the trench 100' where conductive lines 342, 344, and 346 enter into three layers of polysilicon in accordance with one embodiment of the present invention. In this embodiment, the polysilicon 122-1, 122-2, 122-3 may serve as plates (or layers) for capacitors. The type of structure as shown in trench 100' with multiple levels of polysilicon separated by a dielectric layer may be utilized for a variety of purposes such as, for example, using the multilevel polysilicon capacitors as storage nodes in a DRAM or eDRAM (embedded DRAM).

Figure 13:
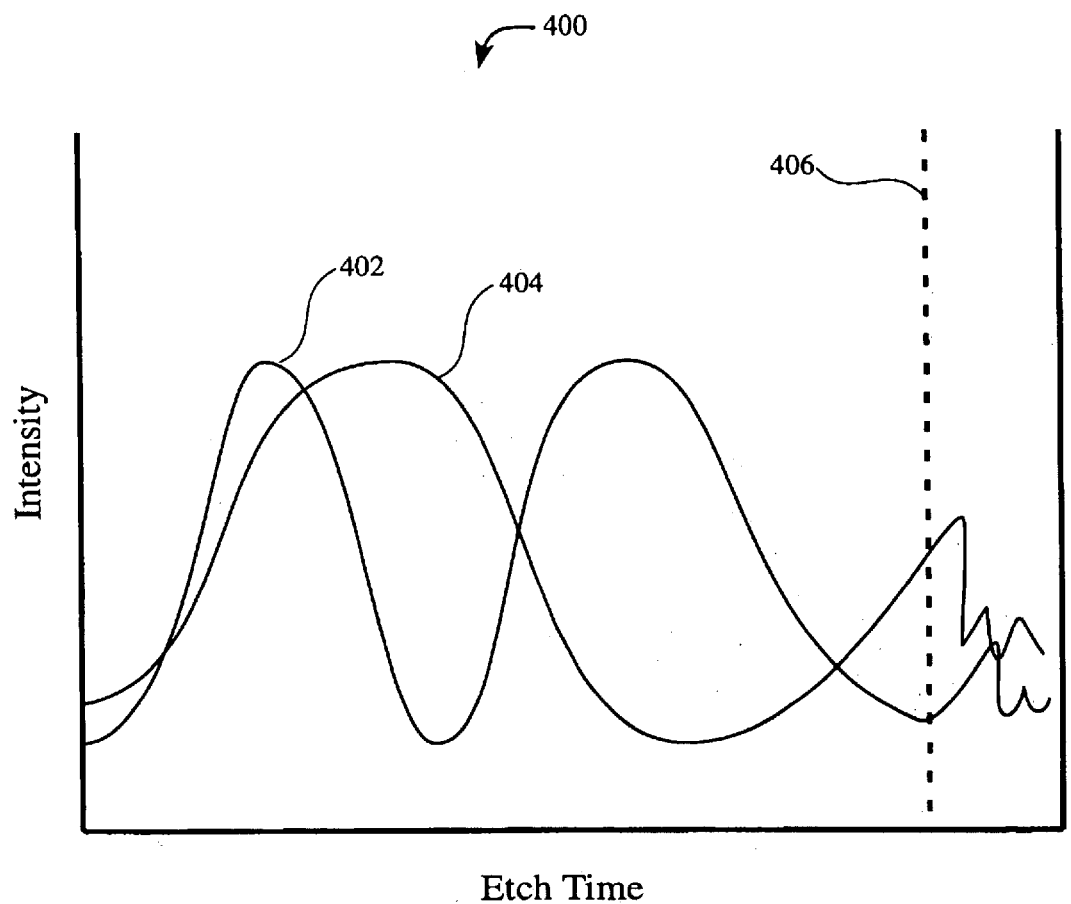
FIG. 13 shows an interferometry graph where a y-axis measures the intensity of two light signals and an x-axis measures an etch time during the planarization etches in accordance with one embodiment of the present invention.

FIG. 13 shows an interferometry graph 400 where a y-axis measures the intensity of two light signals and an x-axis measures an etch time during the planarization etches 124-1, 124-2, and 124-3 in accordance with one embodiment of the present invention. As described above in reference to FIGS. 2, 5, and 8, interferometric endpoint detection (IEP) is utilized to determine the stop point of the planarization etches 124-1, 124-2, and 124-3. IEP utilizes a beam of photons at a particular wavelength that a material being planarized is at partially transparent The beam is applied to the material, and a portion of the beam is reflected back by an upper surface of the material and a portion of the beam is reflected back by a lower portion of the material. The reflected portions of the beam may be detected by any type of photodetector that can detect the wavelengths being utilized. The reflected portions of the beam optically interfere with each other in accordance with the equation $2d=N(\lambda/n)$, where $\lambda$ is a wavelength of the beam, d is the thickness of the material, and n is the refractive index of the material. Integral values of N produce intensity maximum values and half values of N produce intensity minimum values when phase reversal does not occur at the interface (e.g. top and bottom surfaces of the material). If phase reversal does occur at one of the interfaces, integral values of N result in intensity minimums and half integral values of N result in intensity maximums. When the thickness of the material nears 0, the sinusoidal curve fluctuates in an irregular manner. The difference in adjacent maximums and the difference in adjacent minimums maybe discerned by the equation $\frac{1}{2}(\lambda/n)$. Therefore, by observing the intensity curve, the amount of the material that has been removed may be calculated. In addition, a more accurate reading of the material etched may be obtained by using multiple light beams with the above method and by monitoring multiple sinusoidal curves and the related amount of the material etched.

As a result, by using two light beams of differing wavelengths, graphs depicting the sinusoidal curves of the multiple reflected light signals may be produced such as, for example, the interferometric graph 400. The graph 400 shows two different light signals 402 and 404 oscillating as etch time increases. It should be appreciated that the light signals 402 and 404 may be any wavelength that would enable accurate measurement of endpoint detection. In addition, any number of wavelengths may be utilized to obtain endpoint detection. In one embodiment, the light signals 402 and 404 are 500 nm and 800 nm respectively. As etching continues, the graph 400 will show peaks and valleys for the two light signals. By knowing how much etching takes place at the peaks and valleys as discussed above, the oscillations of the light signals may be monitored to determine when a desired amount of polysilicon has been removed. Consequently, the planarization etch 124 may be stopped at point just before all of a polysilicon layer has been removed such as shown by line 406. Where etching time progresses past the line 406, the sinusoidal character of the light signals 402 and 404 become irregular showing that all of the material that was being etched has been removed and the removal process is entering into the next layer. Therefore, by utilizing differing chemistries for recess etching and planarization etching along with IEP, accurate endpoint detection may be conducted without having to use a CMP apparatus.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, aid equivalents as fall within the true spirit and scope of the invention.

What is claimed is:

1. A method for processing recess etch operations in substrates, comprising:
   a) forming a hard mask over the substrate;
   b) etching a trench in the substrate using the hard mask;
   c) forming a dielectric layer over the hard mask and in the trench, the electric layer configured to line the trench;

d) applying a conductive material over the dielectric layer such that a blanket of the conductive material lies over the hard mask and fills the trench;

e1) planarization etching the conductive material to substantially planarize the conductive material;

e2) utilizing interferometric endpoint detection to identify an endpoint of the planarization etching, the endpoint of the planarization etching occurring so as to leave a portion of the conductive material over the dielectric layer that overlies the hard mask;

e3) stopping the planarization etching upon identification of the endpoint of the planarization etching; and f) recess etching the conductive material so as to remove the conductive material over the dielectric layer that overlies the hard mask and removes at least part of the conductive material from within the trench, wherein the recess etching is performed using a different chemistry than that used to perform the planarization etching.

2. A method for processing recess etch operations in substrates as recited in claim 1, further comprising:

repeating operations (c) through (f) one or more times to form multiple layers of the conductive material in the trench.

3. A method for processing recess etch operations in substrates as recited in claim 1, wherein the hardmask is protected by utilizing the interferometric endpoint detection to identify an endpoint of the planarization etching.

4. A method for processing recess etch operations in substrates as recited in claim 1, wherein the planarization etching and the recess etching occurs in an etch chamber thereby increasing wafer production throughput.

5. A method for processing recess etch operations in substrates as recited in claim 1, wherein the planarization etching of the conductive material utilizes a first chemistry including $Cl_2$, He, and $SF_6$.

6. A method for processing recess etch operations in substrates as recited in claim 6, wherein a $Cl_2$ flow rate is between about 20 sccms and about 200 sccms, a He flow rate is between about 20 sccms and about 500 sccms, and a $SF_6$ flow rate is between about 2 sccms and about 50 sccms.

7. A method for processing recess etch operations in substrates as recited in claim 1, wherein the recess etching utilizes a second chemistry including Ar and $SF_6$.

8. A method for processing recess etch operations in substrates as recited in claim 7, wherein an Ar flow rate is between about 0 sccms and about 300 sccms, and a $SF_6$ flow rate is between about 10 sccms and about 100 sccms.

9. A method for processing recess etch operations in substrates as recited in claim 1, wherein the recess etching is used with one of an interferometric endpoint (IEP) detection and a timed etching to monitor the removal of the conductive material.

10. A method for processing recess etch operations, in substrates, comprising:

a) forming a hard mask over the substrate;

b) etching a trench in the substrate using the hard mask;

c) forming a dielectric layer over the hard mask and in the trench, the dielectric layer configured to line the trench;

d) applying a conductive material over the dielectric layer such that a blanket of the conductive material lies over the hard mask and fills the trench;

e1) planarization etching the conductive material using a first chemistry to substantially planarize the conductive material;

e2) utilizing interferometric endpoint detection to identify an endpoint of the planarization etching, the endpoint of the planarization etching occurring so as to leave a portion of the conductive material over the dielectric layer that overlies the hard mask;

e3) stopping the planarization etching upon identification of the endpoint of the planarization etching;

f) recess etching the conductive material using a second chemistry and one of the interferometry monitoring and a timed etch so as to remove the conductive material over the dielectric layer that overlies the hard mask and removes at least part of the conductive material from within the trench; and g) repeating operations (c) through (f) one or more times to form multiple layers of the conductive material in the trench.

11. A method for processing recess etch operations in substrates as recited in claim 10, wherein the hardmask is protected by utilizing the interferometric endpoint detection to identify an endpoint of the planarization etching.

12. A method for processing recess etch operations in substrates as recited in claim 10, wherein the planarization etching and the recess etching occurs in an etch chamber thereby increasing wafer production throughput.

13. A method for processing recess etch operations in substrates as recited in claim 10, wherein the first chemistry including $Cl_2$, He, and $SF_6$.

14. A method for processing recess etch operations in substrates as recited in claim 13, wherein a $Cl_2$ flow rate is between about 20 sccms and about 200 sccms, a He flow rate is between about 20 sccms and about 500 sccms, and a $SF_6$ flow rate is between about 2 sccms and about 50 sccms.

15. A method for processing recess etch operations in substrates as recited in claim 10, wherein the second chemistry including Ar and $SF_6$.

16. A method for processing recess etch operations in substrates as recited in claim 15, wherein an Ar flow rate is between about 0 sccms and about 300 sccms, and a $SF_6$ flow rate is between about 10 sccms and about 100 sccms.

17. A method for processing recess etch operations in substrates, comprising:

a) forming a hard mask over the substrate;

b) etching a trench in the substrate using the hard mask;

c) forming a silicon dioxide layer over the hard mask and in the trench, the silicon dioxide layer configured to line the trench;

d) applying a polysilicon material over the dielectric layer such that a blanket of the polysilicon material lies over the hard mask and fills the trench;

e1) planarization etching the polysilicon material to substantially planarize the polysilicon material, the planarization etching of the polysilicon material using a first chemistry including $Cl_2$, He, and $SF_6$;

e2) utilizing interferometric endpoint detection to identify an endpoint of the planarization etching, the endpoint of the planarization etching occurring so as to leave a portion of the polysilicon material over the silicon dioxide layer that overlies the hard mask;

e3) stopping the planarization etching upon identification of the endpoint of the planarization etching; and f) recess etching the polysilicon material using one of the interferometry monitoring and a timed etch so as to remove the polysilicon material over the silicon dioxide layer that overlies the hard mask and removes at least part of the polysilicon material from within the trench, the recess etching using a second chemistry including Ar and $SF_6$.

18. A method for processing recess etch operations in substrates as recited in claim 17, wherein the first chemistry is defined by a $Cl_2$ flow rate of about 100 sccms, a He flow rate of about 100 sccms, and a $SF_6$ flow rate of about 10 sccms.

19. A method for processing recess etch operations in substrates as recited in claim 17, wherein the second chemistry is defined by an Ar flow rate of about 200 sccms and a $SF_6$ flow rate of about 15 sccms.

20. A method for processing recess etch operations in substrates as recited in claim 17, wherein the planarization etching occurs in an etching chamber which utilizes a top power between 800 watts to about 1200 watts, a bottom power between 40 watts to about 100 watts, a gas pressure of between about 3 mTorr to about 10 mTorr, and a temperature of between about 10 C. and about 60 C.

21. A method for processing recess etch operations in substrates as recited in claim 17, wherein the planarization etching occurs in an etching chamber which utilizes a top power of about 1000 watts, a bottom power of about 66 watts, a gas pressure of about about 5 mTorr, and a temperature of about 30 C.

22. A method for processing recess etch operations in substrates as recited in claim 17, wherein the interferometric endpoint detection includes using a first light signal with a first wavelength, and a second light signal with a second wavelength, the first wavelength being different than the second wavelength.

23. A method for processing recess etch operations in substrates as recited in claim 17, further comprising:

repeating operations (c) through (f) one or more times to form multiple layers of the polysilicon material in the trench.

* * * * *